(12) United States Patent
Li et al.

(10) Patent No.: US 6,395,647 B1
(45) Date of Patent: May 28, 2002

(54) CHEMICAL TREATMENT OF SEMICONDUCTOR SUBSTRATES

(75) Inventors: Li Li, Meridian; Weimin Li, Boise, both of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/388,570

(22) Filed: Sep. 2, 1999

(51) Int. Cl.[7] ............... H01L 21/31; H01L 21/469
(52) U.S. Cl. ............... 438/758; 438/787; 438/790
(58) Field of Search ................. 438/787, 790, 438/758, 760, 622, 765

(56) References Cited

U.S. PATENT DOCUMENTS

| | | | |
|---|---|---|---|
| 5,807,607 A | * 9/1998 | Smith et al. | |
| 5,843,535 A | 12/1998 | Dobson | |
| 5,858,880 A | 1/1999 | Dobson et al. | |
| 5,874,367 A | 2/1999 | Dobson | |
| 5,972,862 A | * 10/1999 | Torii et al. | 510/175 |
| 6,008,540 A | * 12/1999 | Lu et al. | 257/758 |
| 6,076,585 A | * 6/2000 | Klingbeil et al. | 156/584 |
| 6,130,152 A | * 10/2000 | Smith et al. | 438/622 |
| 6,140,249 A | * 10/2000 | Sharan | 438/765 |

OTHER PUBLICATIONS

Advanced SiO2 Planarization Using Silane and H2O2, Semiconductor International 86, Dec. 1994; pp. 86–88.
Techniques for Planarizing Device Topography, Kathy Skidmore, Apr. 1988, pp. 115–119.
Allied Signal Advanced Materials, Spin/Bake/Cure Procedure for Sin–On–Glass Materials for Interlevel and Intermetal Dielectric Planarization, pp. 1–5.
TechNotes, Advanced Electronics Resins, Dow Chemical Company, Process Guide for Photo–Imageable BCB; pp. 1–5.

* cited by examiner

*Primary Examiner*—Matthew Smith
*Assistant Examiner*—V. Yevsikov
(74) *Attorney, Agent, or Firm*—Knobbe, Martens, Olson & Bear LLP (57) ABSTRACT

A method is disclosed for removing liquids from a semiconductor substrate by contacting the liquid on the substrate with a liquid which attracts the liquid on the substrate, separating the liquids from the substrate, and inducing a phase transition in a layer on the substrate. In particular, the method is applicable to removing water from a water-containing layer on the substrate by contacting the layer with a hygroscopic liquid. Trenches on a substrate can be isolated by filling the trenches with a water-containing gel formed by reacting silane and hydrogen peroxide. The gel is contacted with sulfuric acid to remove a portion of the water from the gel before annealing to form silica in the trenches. Unlike filled trenches formed by conventional technology, there are no voids in the bottom of the trenches. The method is also applicable to forming dielectric layers which cover metal lines, low-dielectric layers, and interlayer dielectric layers. The liquid may be applied to the substrate by chemical vapor deposition or by spin-applying.

19 Claims, 8 Drawing Sheets

CHEMICAL TREATMENT OF SEMICONDUCTOR SUBSTRATES

BACKGROUND OF THE INVENTION

1. Field of the Invention

The present invention relates to a method of treating semiconductor substrates by exposing the substrate to a hygroscopic liquid. The treatment minimizes the formation of voids in the fabricated semiconductor.

2. Description of the Related Art

During the fabrication of semiconductors and integrated circuits, it is often necessary to remove liquids such as water or solvents from the semiconductor or integrated circuit. For example, the semiconductor may be exposed to water through contact with aqueous solutions. At least a portion of the water is likely to remain on the semiconductor after the contacting. Alternatively, water may be formed as a reaction product during the chip fabrication. For example, U.S. Pat. Nos. 5,858,880 and 5,874,367 describe a method of planarizing wafers by forming silicon oxide films on the surface of the wafer by reacting silane with hydrogen peroxide to form silicon hydroxide. The silicon hydroxide polymerizes to form a gel containing water and polymers having the general formula $Si_x(OH)_y$ or $Si_xH_y(OH)_z$. More water is formed when the polymers are annealed to form the final $SiO_2$ planarizing layer. The water is normally removed from the planarized wafer by heating.

Removing water from the wafer by heating can lead to structural problems in the wafer. For example, when the planarizing silicon hydroxide polymer gel layer described above is heated and annealed, the layer can crack if the rate of moisture removal is not controlled carefully during the phase transition from a gel to a solid. Controlling the rate of water loss can be achieved by careful temperature control, but this is expensive and time consuming. Alternatively, a silica capping layer can be formed on top of the wafer to control the rate of moisture release. Processing conditions must be controlled carefully to prevent cracking of the polymer layer. There is a need for more convenient and reliable methods of removing water during the processing of wafers.

The semiconductor or integrated circuit may also be exposed to solvents during processing. For example, spin-on layers are formed by spin applying silicon oxide, with or without dopants, in a solvent. The solvent is removed by baking, leaving a planarized $SiO_2$ layer. The layer is subject to cracking during the drying process while the layer undergoes a phase change into a solid layer. There is a need for improved methods of removing solvents from semiconductor substrates without damaging the wafer.

SUMMARY OF THE INVENTION

One aspect of the invention relates to a method of removing at least a portion of a first liquid from a liquid-containing layer on a semiconductor substrate. The method comprises forming a first layer containing the first liquid on the semiconductor substrate, contacting the first layer with a second liquid which attracts the first liquid in the first layer, and transferring at least a portion of the first liquid from the first layer into the second liquid. The method also comprises separating the second liquid from the first layer, removing at least a portion of the first liquid from the first layer; and inducing a phase transition in the first layer. The phase transition may occur during or after the contacting.

Another embodiment of the invention comprises annealing the substrate and the first layer. Advantageously, the first layer undergoes the phase transition during the annealing.

Another aspect of the invention relates to a method of isolating plural trenches on a substrate. The method comprises placing the substrate in a chamber, introducing silicon-containing vapor and hydrogen peroxide vapor into the chamber, and reacting the silicon-containing vapor with the hydrogen peroxide vapor to form a liquid layer comprising silicon-containing oligomers and water on the substrate, where the liquid layer fills at least a portion of the trenches. The method also comprises contacting the liquid layer with a hygroscopic liquid to remove at least a portion of the water in the liquid layer, separating the hygroscopic liquid from the liquid layer, and heating the liquid layer to a temperature sufficient to form a solid comprising silica in at least a portion of the trenches.

In one embodiment, the silicon-containing vapor comprises silane. In some embodiments, the hygroscopic liquid is selected from sulfuric acid, phosphoric acid, and a hygroscopic organic solvent. Advantageously, the hygroscopic liquid comprises sulfuric acid. In an embodiment where the hygroscopic liquid comprises sulfuric acid, the hygroscopic liquid comprising sulfuric acid is contacted with the liquid layer at a temperature between 0 and 300° Centigrade. In another embodiment, the hygroscopic liquid comprising sulfuric acid is contacted with the liquid layer at a temperature between 100 and 200° Centigrade. In another embodiment, the hygroscopic liquid comprising sulfuric acid is contacted with the liquid layer at a temperature of approximately 150° Centigrade.

In an embodiment of the invention, the hygroscopic liquid comprising sulfuric acid is at a concentration of between 50 and 98 weight percent sulfuric acid. In another embodiment, the hygroscopic liquid comprising sulfuric acid is at a concentration of approximately 98 weight percent sulfuric acid.

In an embodiment of the invention, the liquid layer is heated to a temperature between 100 and 1100° Centigrade to form the solid comprising silica in at least some of the trenches. In another embodiment, the liquid layer is heated to a temperature between 300 and 800° Centigrade. In yet another embodiment, the liquid layer is heated to a temperature of approximately 400° Centigrade.

Another aspect of the invention relates to a method of treating a semi-conductor substrate. The method comprises: placing the substrate in a chamber, introducing silicon-containing vapor and hydrogen peroxide vapor into the chamber, reacting the silicon-containing vapor with the hydrogen peroxide vapor to form a liquid layer comprising silicon-containing oligomers and water on the substrate, and treating the liquid layer with a hygroscopic liquid, thereby removing at least a portion of the water in the liquid layer.

The method may further comprise separating the hygroscopic liquid from the liquid layer. In an embodiment of the invention, the method further comprises heating the liquid layer after separating the hygroscopic liquid from the liquid layer. Advantageously, the heating forms a solid comprising silica from the liquid layer.

In an embodiment of the invention, the solid comprising silica forms an interlayer dielectric layer on the substrate. Advantageously, the interlayer dielectric layer comprises a trench. The method may further comprise filling the trench with a metal. In an embodiment, the substrate comprises a plurality of trenches, and the solid comprising silica isolates the substrate between the trenches.

In another embodiment, the substrate comprises a plurality of metal lines on the substrate, and the solid comprising silica forms a dielectric layer over the plurality of metal lines.

In an embodiment of the invention, the silicon-containing vapor comprises methyl silane, and the liquid layer is heated to a temperature sufficient to convert then liquid layer to a solid comprising silicon oxide. Advantageously, the solid comprising silicon oxide forms a low-dielectric layer.

Another aspect of the invention concerns a method of treating a semiconductor substrate in a chamber. The method comprises applying a first liquid comprising silicon and a second liquid onto the substrate. The method further comprises contacting the first liquid comprising silicon and the second liquid with a third liquid which attracts the second liquid, removing at least a portion of the second liquid; and separating the third liquid from the first liquid comprising silicon on the substrate. In an embodiment, the second liquid comprises water and the third liquid comprises a hygroscopic liquid.

In an embodiment of the invention, the first liquid comprising silicon comprises silicon dioxide. In another embodiment, the first liquid further comprises a dopant selected from the group consisting of arsenic, antimony, boron, phosphorus, and gallium. In one embodiment, the applying comprises spin applying the first liquid comprising silicon and the second liquid onto the substrate. In another embodiment, the applying comprises chemical vapor depositing the first liquid comprising silicon and the second liquid onto the substrate.

In another embodiment, the applying comprises introducing silicon-containing vapor and hydrogen peroxide vapor into the chamber and reacting the silicon-containing vapor with the hydrogen peroxide vapor to form the first liquid comprising silicon and the second liquid, where the second liquid comprises water.

Another aspect of the method of the invention concerns a method of treating a semiconductor substrate in a chamber. The method comprises applying a first liquid onto the substrate and heating the substrate and the first liquid, thereby forming a second liquid and a third liquid. The method also comprises contacting the second liquid and the third liquid with a fourth liquid which attracts the third liquid, removing at least a portion of the second liquid, and separating the fourth liquid from the second liquid on the substrate.

In an embodiment of the method of the invention, the applying comprises spin applying the first liquid onto the substrate. In another embodiment, the first liquid comprises a siloxane or an organosiloxane. The third liquid advantageously comprises water, and the fourth liquid comprises higher oligomers of the siloxane or organosiloxane. The method may further comprise annealing the substrate and the fourth liquid, forming a layer comprising silicon dioxide.

DETAILED DESCRIPTION OF THE PREFERRED EMBODIMENT

The present application describes a method of drying substrates by contacting the substrate with a hygroscopic liquid. While illustrated in the context of drying semiconductor substrates after flowfilling the semiconductor substrate with silicon hydroxide, the skilled artisan will recognize many other applications for the methods disclosed herein. In particular, the method can be used to dry dielectric layers covering metallic lines and interlayer dielectric layers.

The method is particularly advantageous when there is a phase change in the layer which is being dried, either during or after the drying process.

The method is also applicable to removing other liquids such as solvents from substrates. When the method is applied to removing other liquids, the substrate is contacted with a liquid which attracts the solvent on the substrate. The liquid and solvent are then separated from the substrate, removing the solvent from the semiconductor substrate. The application therefore broadly relates to a method of removing liquids from a semiconductor substrate by contacting the substrate with a liquid which attracts the liquid on the substrate. The method has broad application, and the examples below are only illustrative of the application of the method.

The invention may be performed in different ways, and a specific embodiment will be described below by way of example. The invention is not limited to the specific embodiment in the example, and other examples will be given.

The need for an improved method of drying substrates was recognized when a previously unrecognized problem was identified during the isolation of shallow trenches by filling the trenches with a dielectric such as silicon oxide. The trenches can be filled by reacting silane ($SiH_4$) with hydrogen peroxide ($H_2O_2$) at −5 to 20° C. to form monosilicic acid, $Si(OH)_4$, by the FLOWFILL™ process, described in detail in U.S. Pat. Nos. 5,858,880 and 5,874,367, herein incorporated by reference. The monosilicic acid forms a gel which flows into the trench. The monosilicic acid gel polymerizes to form higher oligomers and water by the reaction:

$$n\ Si(OH)_4 \rightarrow H[OSi(OH)_2]_nOH + (n-1)H_2O \qquad (1)$$

forming a thicker gel. Traditionally, the water is removed from the gel by heating, with or without vacuum. The gel is hardened into an amorphous $SiO_2$ layer by annealing at high temperature, producing yet more water by the reaction:

$$H[OSi(OH)_2]_nOH \rightarrow n\ SiO_2 + (n+1)H_2O. \qquad (2)$$

It was previously known that removing water from the gel by heating can cause cracking of the top of the layer. Heating procedures for minimizing the cracking of the layer are described in the two patents cited above. The heating can be done slowly and/or by forming a silicon oxide capping layer, which acts as a diffusion membrane, controlling the rate of drying.

Figure 1:
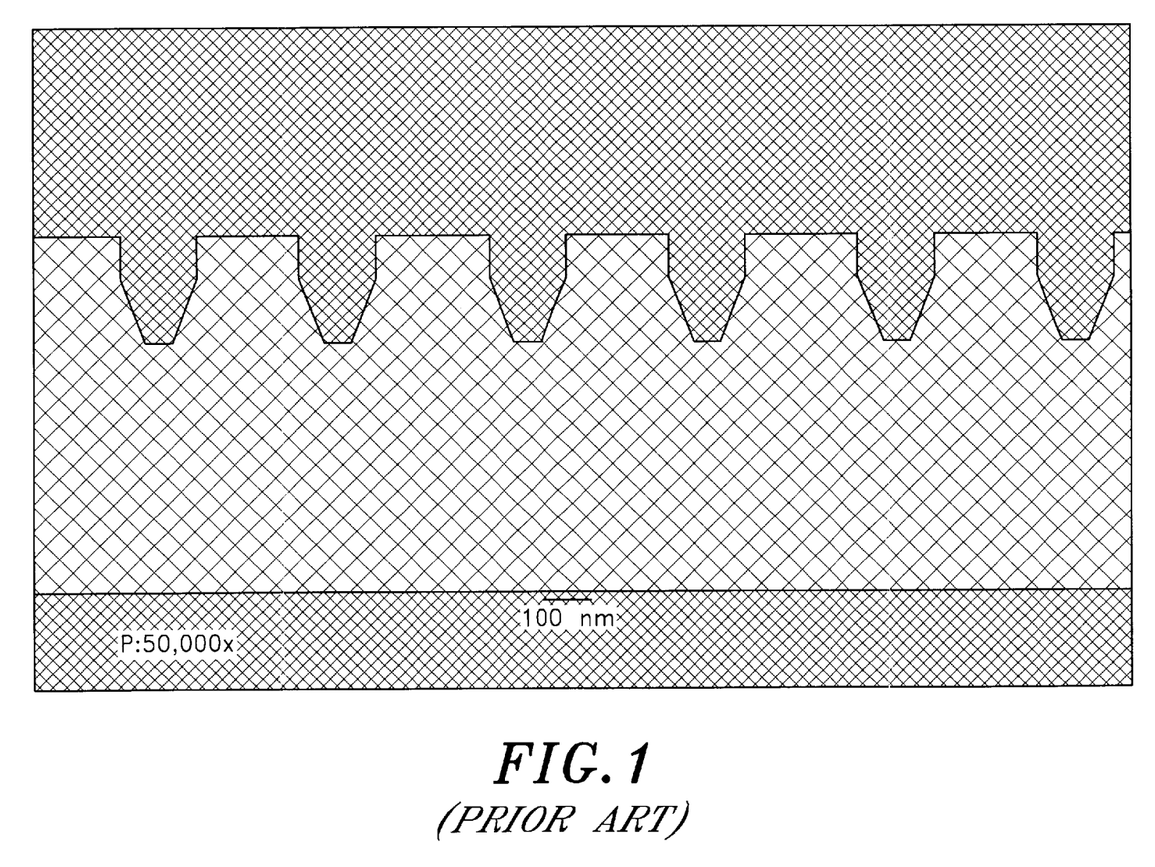
FIG. 1 is an electron micrograph of a flow filled silicon wafer at a magnification of 1000× after a standard anneal at 400° C.
Figure 2:
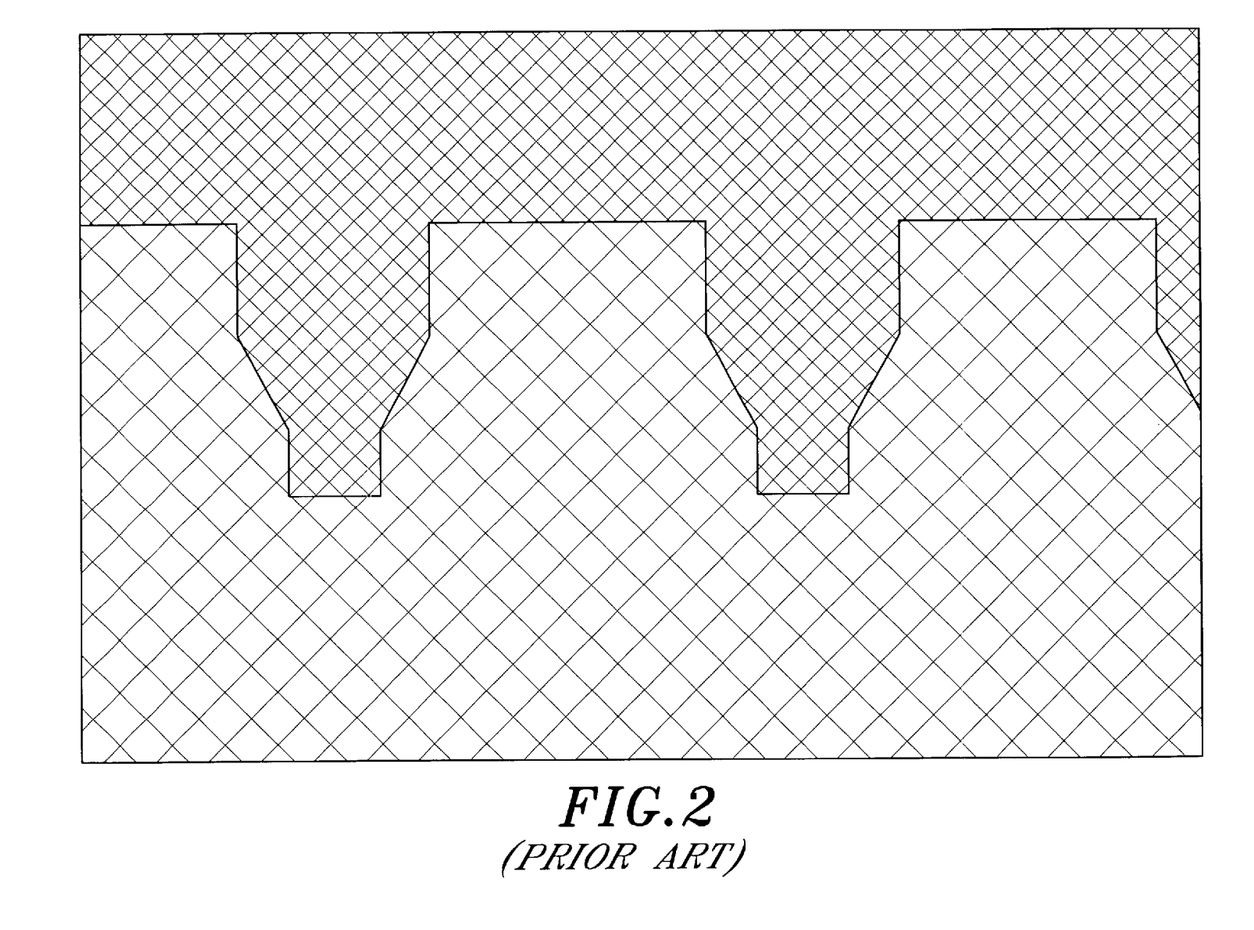
FIG. 2 is an enlargement of the electron micrograph of the flow filled silicon wafer of FIG. 1.
Figure 2A:
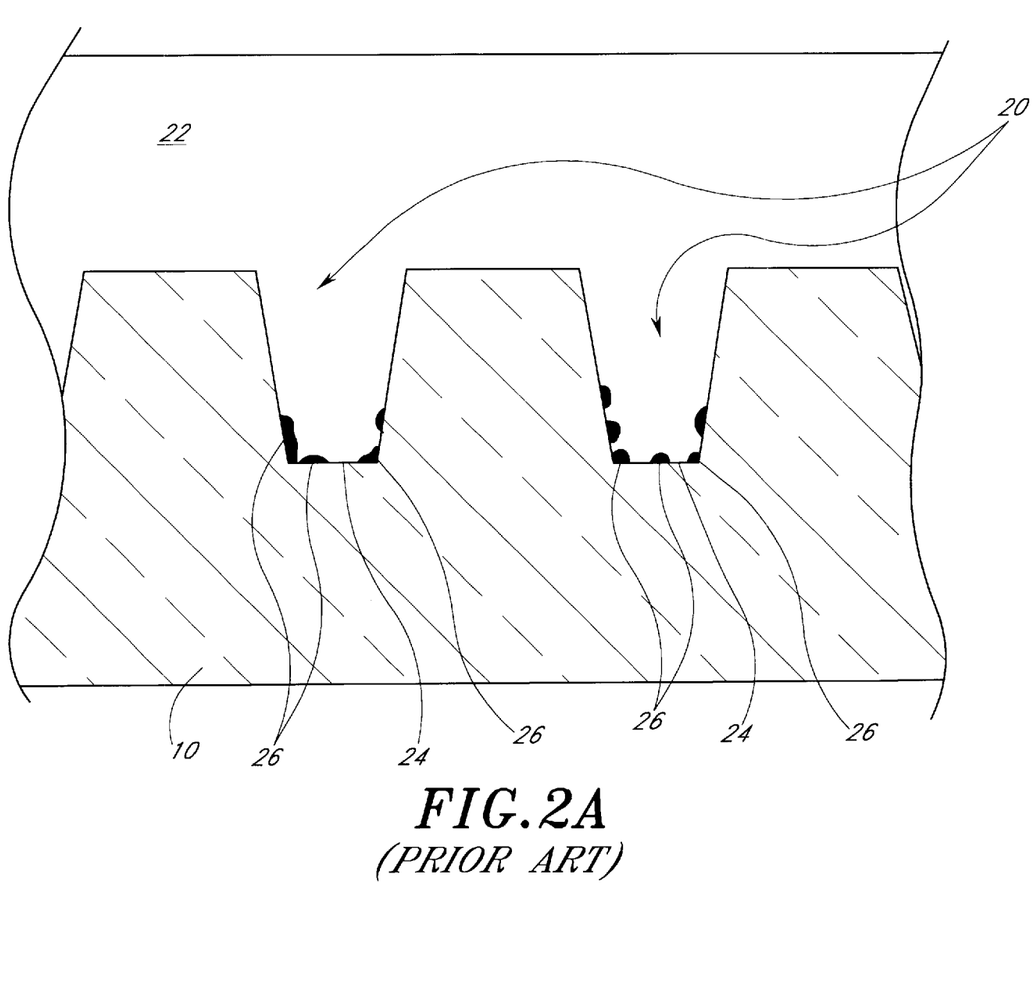
FIG. 2A is a line drawing of the electron micrograph of FIG. 2, illustrating the presence of voids.

FIG. 1 shows a photomicrograph of a series of trenches filled with $SiO_2$ prepared by the standard method of reacting silane with hydrogen peroxide to form a gel followed by annealing at 400° C. FIG. 2 shows an enlargement of one of the filled trenches of FIG. 1. As best seen in the line drawing version of FIG. 2A, there are voids 26 in the oxide 22 at the bottom 24 of the trenches 20 formed within the substrate 10. The presence of the voids 26 is a problem that could lead to poor performance or premature failure of the semiconductor due to the density irregularities in the filled trenches.

It has unexpectedly been discovered that formation of the voids in the filled trenches can be avoided by exposing the gel to a hygroscopic liquid prior to annealing, according to an embodiment of the method of the invention.

Figure 3:
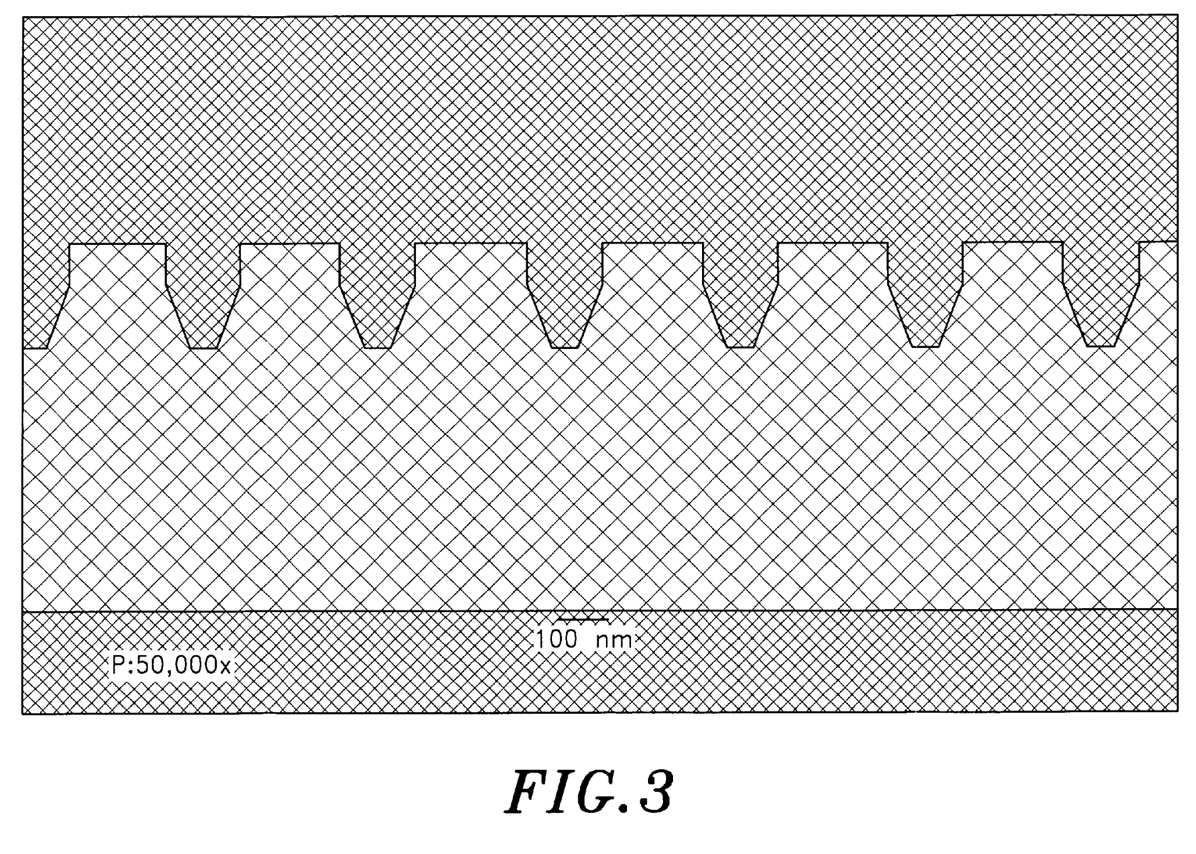
FIG. 3 is an electron micrograph of a flow filled silicon wafer at a magnification of 1000×, where the flow filled silicon wafer was dipped in sulfuric acid before annealing at 400° C.
Figure 4:
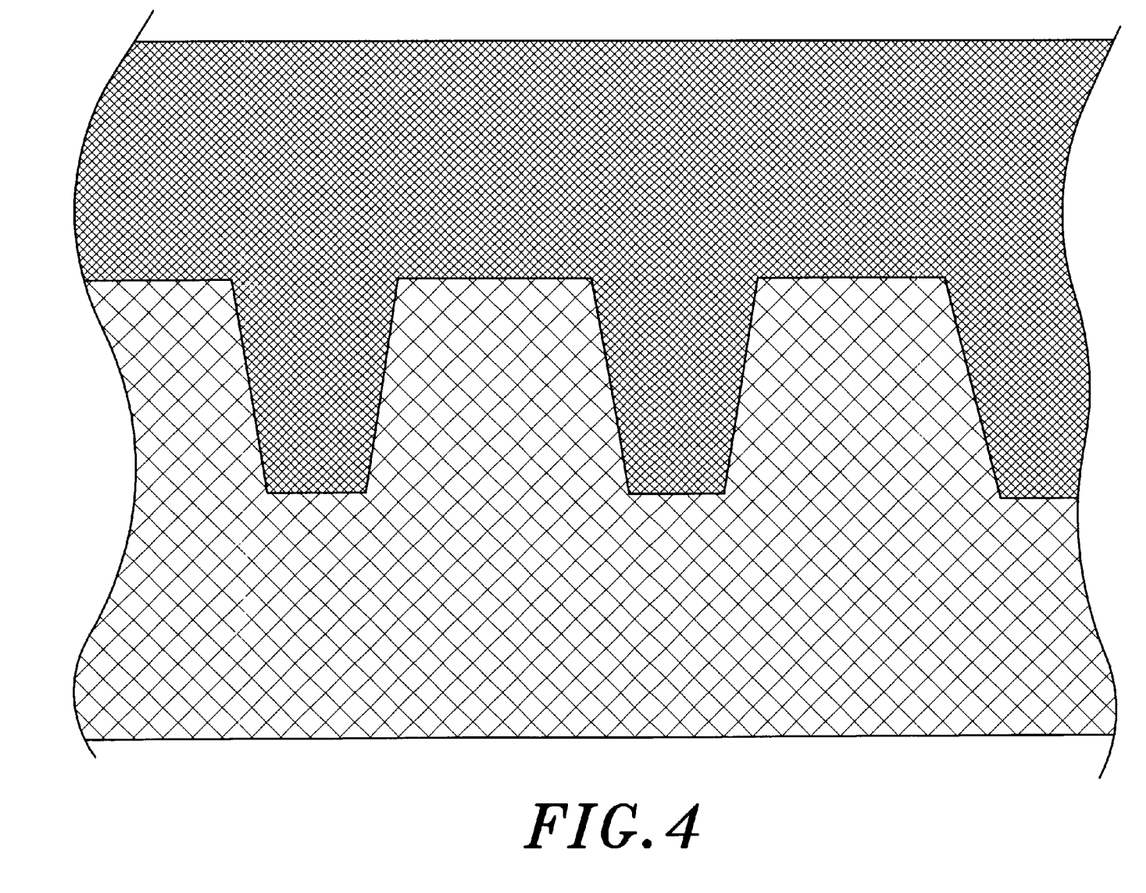
FIG. 4 is an enlargement of the electron micrograph of the flow filled silicon wafer of FIG. 3.
Figure 4A:
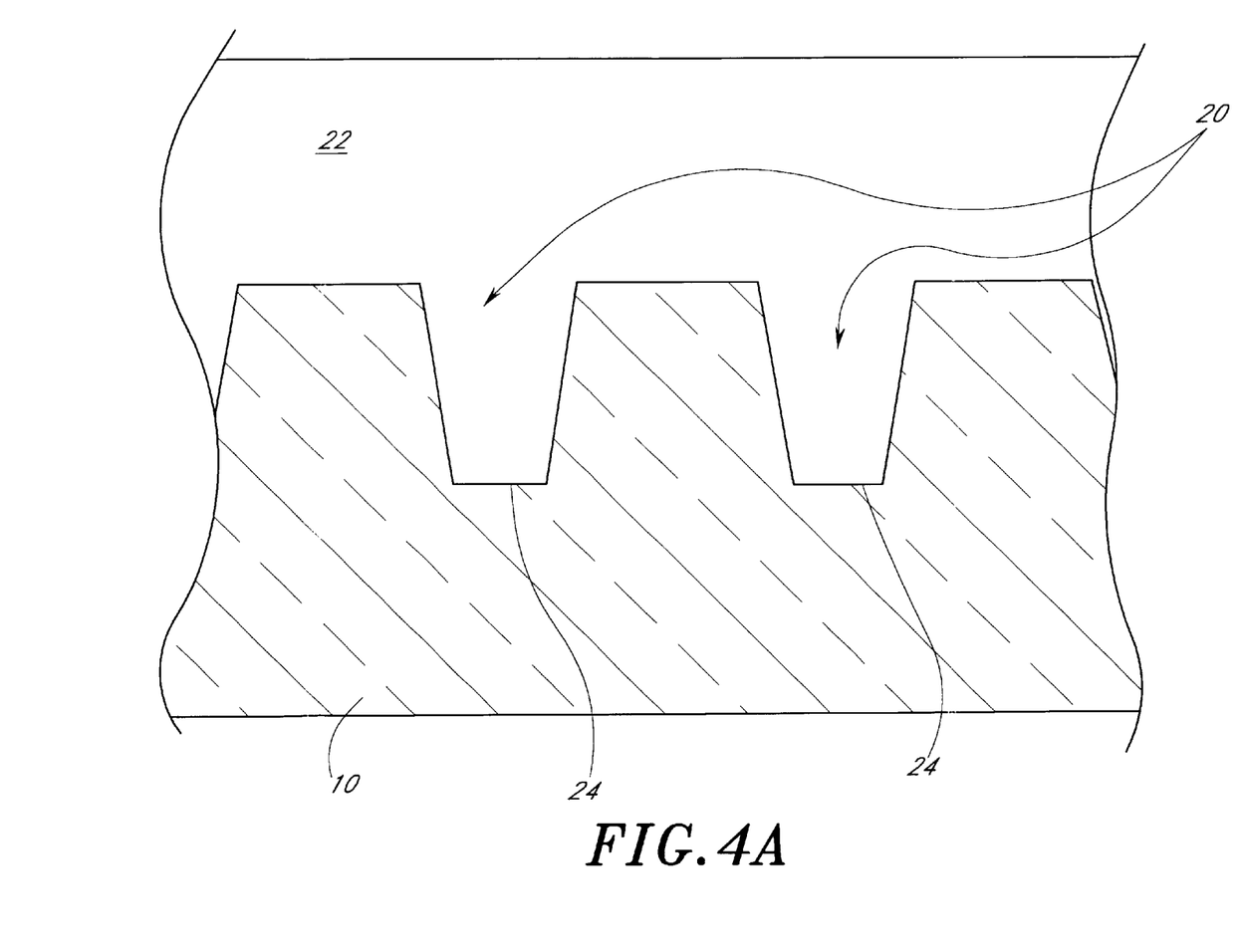
FIG. 4A is a line drawing of the electron micrograph of FIG. 4, illustrating the absence of voids.

FIG. 3 shows a photomicrograph of the filled trenches formed by contacting the gel with sulfuric acid prior to annealing, according to an embodiment of the method of the invention. FIG. 4 shows an enlargement of one of the filled trenches from FIG. 3. As best seen in the line drawing version of FIG. 4A, in contrast to the filled trenches formed by the traditional method, there are no voids in the insulator 22 at the bottom 24 of the filled trenches 20 formed within the substrate 10 when the gel was exposed to a hygroscopic liquid prior to annealing.

It is believed that the voids at the bottom of the filled trenches formed by the traditional method are caused by evaporation of the water formed during the oligomerization of monosilicic acid in the gel, as shown in equation (1) above. When the wafer is annealed, the previously formed water vaporizes while the oligomers in the gel are simultaneously dehydroxylated and undergo a phase change to form the solid silica layer and water, as shown in equation (2) above. The solid silicon oxide can't flow into the voids left by the departing water.

By contrast, when the water-containing silicon oligomer gel is exposed to a hygroscopic liquid in accordance with an embodiment of the invention, the hygroscopic liquid removes at least a portion of the water from the gel at low temperature before the wafer and gel are annealed at high temperature. The gel which fills the trench can flow to fill any voids which were formed by the vaporizing water. Far less water is left in the gel after exposure to the hygroscopic liquid than with the conventional process. Less water is therefore available to vaporize during the annealing process to form voids. Further, it is believed that the hygroscopic liquid dehydroxylates the oligomers of monosilicic acid in addition to removing the already-formed water. The dehydroxylation of the oligomers means that less water is produced when the silica solid is formed from the gel by a phase transition during annealing, as shown in equation (2) above. The high temperature anneal after drying with the hygroscopic liquid according to an embodiment of the invention is therefore mainly to reflow the silica film rather than to simultaneously remove water while reflowing the film, as in the conventional method.

The method of removing water from the semiconductor substrate by exposing the substrate to a hygroscopic liquid is particularly advantageous when a phase transition occurs during or after exposure to the hygroscopic liquid. For example, the water-containing silicon oligomer gel from the FLOWFILL™ process undergoes a phase transition from a fluid gel to a solid during the annealing process. By removing the water from the fluid gel before the gel undergoes the phase transition to the solid silica layer, the gel can flow into any voids formed prior to vaporization of water, and little water remains in the gel to form new voids when the remaining water vaporizes.

The method more generally is applicable to any process where a liquid exists in a material which is flowing. For example, the method can be applied to layers containing organic solvents or inorganic solvents other than water. By removing liquid from the flowing material with a liquid which attracts the liquid in the flowing material, the solid formed after the phase change of the flowing material often has more uniform density than the solid formed by conventional technology.

Figure 5:
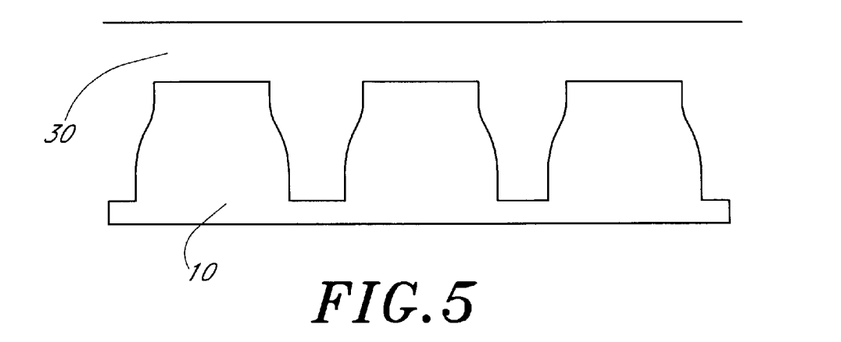
FIG. 5 is a partial cross-sectional view of a substrate with a plurality of trenches covered by a liquid layer containing silicon oligomers.

FIG. 5 illustrates the application of the embodiment of the method of the invention to shallow trench isolation (STI) in more detail. Although FIG. 5 illustrates a specific embodiment of the method of the invention, the method is not limited to the embodiment illustrated in FIG. 5.

FIG. 5 shows a substrate 10 covered with a liquid-containing layer 30. Although FIG. 3 shows the liquid-containing layer 30 filling a plurality of trenches 20, the trenches 20 illustrate the embodiment of shallow trench isolation and are not meant to be limiting on the scope of the method of the invention.

The substrate 10 may be a semiconductor such as silicon or gallium arsenide, or it may be an insulating layer if Silicon-On Insulator (SOI) or a similar technology is used. For example, the insulator may be sapphire, if Silicon-On-Sapphire (SOS) is used. The methods of the present invention have broad application to a wide variety of substrates 10.

The liquid in the liquid-containing layer 30 can be water or another solvent, including, but not limited to, an inorganic solvent or an organic solvent. Suitable organic solvents include, but are not limited to, hydrocarbons, chlorinated solvents, alcohols, ethers, aldehydes, ketones, silicones, or any other suitable liquid.

The liquid-containing layer 30 may be applied to the substrate 10 by any suitable method including spraying, chemical vapor deposition, or the spin-on process.

Figure 6:
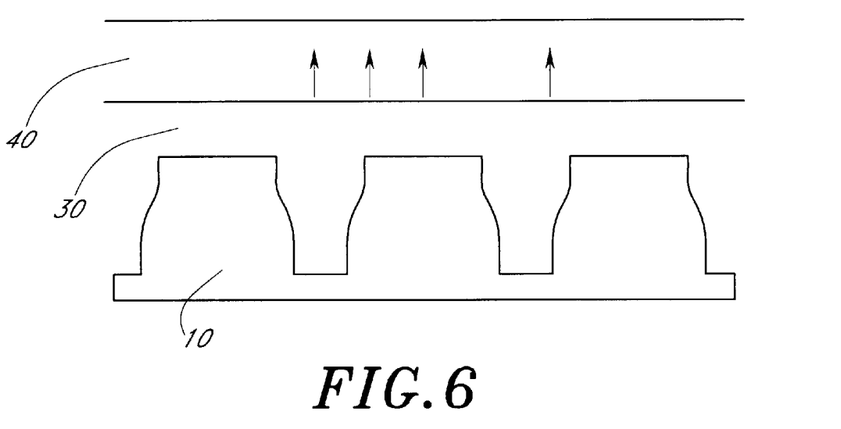
FIG. 6 illustrates the substrate of FIG. 5 after contacting the liquid layer with a hygroscopic liquid.

The liquid-containing layer 30 is contacted with a liquid-attractive liquid 40, as shown in FIG. 6. The liquid-attractive liquid 40 is chosen so that the liquid in the liquid-containing layer 30 is attracted by the liquid-attractive liquid 40. The liquid-attractive liquid 40 draws at least a portion of the liquid in the liquid-containing layer 30 into the liquid-attractive liquid 40, as indicated by the arrows in FIG. 6.

If the liquid in the liquid-containing layer 30 is water, the liquid-attractive liquid 40 is preferably a hygroscopic liquid. Suitable hygroscopic liquids include, but are not limited to, sulfuric acid, phosphoric acid, and hygroscopic organic solvents. Anhydrous ethanol is an example of a hygroscopic organic solvent which is suitable for use in the invention. Sulfuric acid is an exemplary hygroscopic liquid. The hygroscopic liquid as the liquid-attractive liquid 40 removes at least a portion of the water from the liquid-containing layer 30.

If the hygroscopic liquid is sulfuric acid, the concentration of sulfuric acid is preferably between 50 and 98 weight percent sulfuric acid, more preferably between 80 and 98 weight percent sulfuric acid, and most preferably approximately 98 weight percent sulfuric acid. If the hygroscopic liquid is phosphoric acid, the concentration of phosphoric acid is preferably between 70 and 100 weight percent phosphoric acid, more preferably between 75 and 85 weight percent phosphoric acid, and most preferably approximately 85 weight percent phosphoric acid.

The substrate 10 and liquid-containing layer 30 are contacted with the hygroscopic liquid as the liquid-attractive liquid 40 at a temperature of 0 to 300° C., more preferably between 100 to 200° C., and most preferably approximately 150° C. The substrate 10 and liquid-containing layer 30 are contacted with the hygroscopic liquid for a period of 1 to 120 minutes, more preferably between 20 and 60 minutes, and most preferably for approximately 30 minutes.

If the hygroscopic liquid is an organic solvent, the substrate 10 and liquid-containing layer 30 are contacted with the organic hygroscopic solvent at a temperature of 1 to 150° C. and most preferably approximately 50° C.

The liquid-attractive liquid 40 and the liquid which is attracted from the liquid-containing layer 30 are separated from the substrate 10 and liquid-containing layer 30 by any suitable method, for example by tilting the substrate 10 or spin dry.

Another method for separating the liquid-attractive liquid 40 from the substrate 10 and liquid-containing layer 30 is by contacting the liquid-attractive liquid 40 with a liquid in which the liquid-attractive liquid 40 is soluble. The liquid and dissolved liquid-attractive liquid 40 can be separated by tilting the substrate 10. If the liquid in which the liquid-attractive liquid 40 is soluble is sprayed on the substrate 10 and liquid-containing layer 30, the liquid with dissolved liquid-attractive liquid 40 can simply flow off the substrate 10 and liquid-containing layer 30. In another embodiment, the substrate 10 and liquid-containing layer 30 are dipped into the liquid in which the liquid-attractive liquid 40 is soluble. The liquid-attractive liquid 40 dissolves in the liquid in which it is soluble, and the substrate 10 and liquid-containing layer 30 can be lifted out of the liquid, leaving the liquid-attractive liquid 40 behind.

Additional process steps may be performed after removing at least a portion of the liquid from the liquid-containing layer 30 by contacting the substrate 10 and liquid-containing layer 30 with the liquid-attractive liquid 40 without departing from various embodiments of the invention. For example, the substrate 10 and liquid-containing layer 30 may be exposed to reduced pressure and/or heat to remove more liquid from the liquid-containing layer 30. The substrate 10 and liquid-containing layer 30 may be exposed to plasma. In a preferred embodiment, the substrate 10 and liquid-containing layer 30 are annealed to form a solid layer from the liquid-containing layer 30. The solid layer formed by annealing the liquid-containing layer 30 after contacting with the liquid-attractive liquid 40 often has more uniform density than solid layers formed by conventional technology. Other process steps may be performed without departing from various embodiments of the method of the invention.

The method of removing liquid from a liquid-containing layer 30 on a substrate 10 by contacting with a liquid-attractive liquid 40 has broad application, as will be described in more detail in the examples below.

In the embodiment of isolating trenches with the FLOWFILL™ process described earlier and illustrated in FIGS. 5 and 6, the liquid-containing layer 30 is a planarizing layer formed by reacting silane ($SiH_4$) with hydrogen peroxide ($H_2O_2$) in vapor form in a chamber to form monosilicic acid, $Si(OH)_4$. The monosilicic acid condenses onto the surface of the substrate 10 by chemical vapor deposition, flows into the trenches 20, and spontaneously polymerizes to form a gel containing higher oligomers and water. The liquid-containing layer 30 formed by the FLOWFILL™ method has low viscosity, and the liquid-containing layer 30 fills gaps in the substrate 10 and is generally self leveling, forming a planarized surface.

The liquid-containing layer 30 formed by reacting silane and hydrogen peroxide is contacted with a hygroscopic liquid as the liquid-attractive liquid 40 to remove water from the silicon-containing gel. In one preferred embodiment, the hygroscopic liquid is 98% sulfuric acid. Although the sulfuric acid liquid-attractive liquid 40 may be separated from the liquid-containing layer 30 in various ways, one preferred method of separating the sulfuric acid from the liquid-containing layer 30 is by rinsing the substrate 10 and liquid-containing layer 30 with water to dissolve the sulfuric acid. The substrate 10 and liquid-containing layer 30 containing the silicon-containing oligomers are annealed to complete the drying and to dehydroxylate the oligomers, forming silicon oxide and water, as shown in equation (2). The silicon oxide fills at least a portion of the trenches 20, thereby isolating the trenches 20. The substrate 10 and liquid-containing layer 30 are annealed at a temperature of 100 to 1000° C., more preferably 300 to 800° C., and most preferably approximately 400° C. for between 1 and 60 minutes, more preferably 10 to 30 minutes, and most preferably 30 minutes.

The filled trenches 20 shown in FIGS. 3 and 4 were formed by forming a liquid-containing layer 30 with the FLOWFILL™ process, dipping the substrate 10 and liquid-containing layer 30 in 98% sulfuric acid at 150° C. for 30 minutes to remove at least a portion of the water from the gel, dipping the partially dried substrate 10 and liquid-containing layer 30 in deionized water to remove the sulfuric acid, and annealing the substrate 10 and liquid-containing layer 30 at 400° C. for 30 minutes to form the solid silica which fills the trenches 20. As shown in FIG. 4, there were no voids in the bottom of the filled trenches formed by the embodiment of the method of the invention, in contrast with the filled trenches formed by conventional technology.

In another embodiment, the liquid-containing layer 30 is formed on the substrate 10 by chemical vapor deposition through a modified form of the FLOWFILL™ process in which methyl silane ($CH_3SiH_3$) rather than silane is reacted with hydrogen peroxide in the chamber. The liquid-containing layer 30 on the substrate 10 is contacted with a hygroscopic liquid as the liquid-attractive liquid 40 to remove water from the liquid-containing layer 30, the liquid-attractive liquid 40 is separated from the liquid-containing layer 30, and the substrate 10 and liquid-containing layer 30 are annealed to form a layer comprising silicon oxide, just as in the embodiment of the invention with the traditional FLOWFILL™ process.

The layer comprising silicon oxide formed from methylsilane and hydrogen peroxide contains silicon-carbon bonds in addition to silicon-oxygen bonds. The silicon oxide layer with silicon-carbon bonds in addition to silicon-oxygen bonds has a reduced dielectric constant compared to the silicon oxide layer formed by the normal FLOWFILL™ process. In this embodiment of the method, a layer with a low dielectric constant is produced. Low dielectric constant isolation can reduce parasitic capacitance and cross-talk between devices. The low dielectric layer formed with the embodiment of the method of the invention has more uniform density than a low dielectric layer formed through conventional methods.

In another embodiment, the liquid-containing layer 30 is formed by spin applying a mixture of silicon dioxide in a liquid onto the substrate 10 to form a liquid-containing layer 30 through the spin-on process. The liquid in the liquid-containing layer 30 formed by the spin-on process may be water or an organic solvent. Dopants such as arsenic, antimony, boron, phosphorus, and gallium may optionally be included in the liquid. If the liquid in the liquid-containing layer 30 is water, the liquid-containing layer 30 is contacted with a liquid-attractive liquid 40 which is a hygroscopic liquid. If the liquid in the liquid-containing layer 30 is an organic solvent, the liquid-containing layer 30 is contacted with liquid-attractive liquid 40 which attracts the organic solvent in the liquid-containing layer 30 formed by the spin-on process.

After the liquid-containing layer 30 formed by the spin-on process is contacted with the liquid-attractive liquid 40, and the liquid attractive liquid 40 is separated from the liquid-containing layer 30, the substrate 10 and liquid-containing layer 30 formed by the spin-on process are annealed to form a layer comprising silicon dioxide. If dopants are added to the liquid in the liquid-containing layer 30, the layer comprising silicon dioxide is doped with the dopant during the annealing.

In another embodiment of the method of the invention with the spin-on process, the liquid-containing layer 30 is formed by spin applying a liquid comprising a siloxane or an organosiloxane, either with or without an organic solvent. If the liquid-containing layer 30 contains an organic solvent, the liquid-containing layer 30 may be contacted with liquid-attractive liquid 40 which attracts the organic solvent in the liquid-containing layer 30. Ethanol is an example of a suitable liquid-attractive liquid 40 which attracts the organic solvent in the liquid-containing layer 30. After the liquid-containing layer 30 formed by the spin-on process is contacted with the liquid-attractive liquid 40, and the liquid attractive liquid 40 is separated from the liquid-containing layer 30, the substrate 10 and remaining liquid-containing layer 30 formed by the spin-on process are annealed to form a layer comprising silicon dioxide.

Alternatively, or, in addition, the liquid-containing layer 30 may be heated prior to annealing to form a liquid-containing layer comprising higher oligomers of the siloxanes or organosiloxanes and water. The liquid-containing layer 30 comprising higher oligomers of the siloxanes or organosiloxanes and water may be contacted with a liquid-attractive liquid 40 which is a hygroscopic liquid. The hygroscopic liquid removes water from the liquid-containing layer 30. The liquid-containing layer 30 with the higher oligomers of the siloxanes or organosiloxanes is annealed to form a layer comprising silicon dioxide and water. Removing at least a portion of the water in the liquid-containing layer 30 by contacting the liquid-containing layer 30 with a hygroscopic liquid as the liquid-attractive liquid 40 produces a layer comprising silicon dioxide after annealing which contains fewer voids than if the liquid-containing layer 30 had not been contacted with the hygroscopic liquid.

Figure 7:
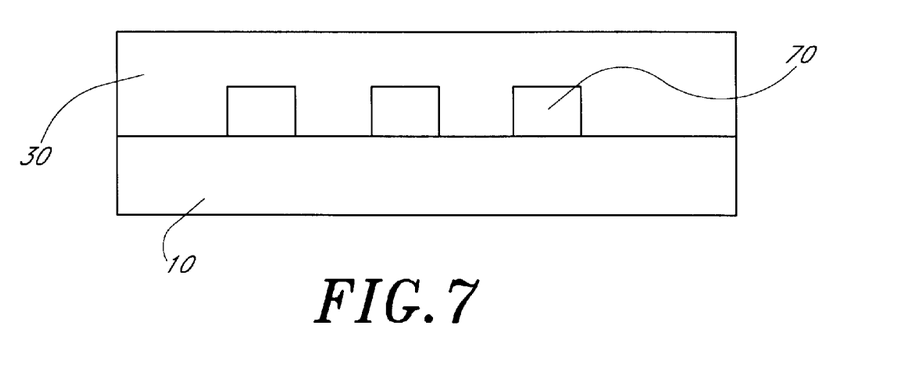
FIG. 7 is a partial cross-sectional view of a substrate with metal lines, where a liquid layer containing silicon oligomers has been deposited over the substrate and metal lines.

Another embodiment of the method of the invention is illustrated in FIG. 7. A plurality of metal lines 50 are present on the substrate 10. The FLOWFILL™ process is used to apply silicon oligomers onto the substrate 10 and metal lines 50 as the liquid-containing layer 30. Alternatively, the spin-on process is used to apply a silicon dioxide slurry in a liquid as the liquid-containing layer 30 onto the substrate 10 and metal lines 50. The liquid-containing layer 30 is contacted with an appropriate liquid-attractive liquid 40, the liquid-attractive liquid 40 is separated from the liquid-containing layer 30, and the substrate 10 and liquid-containing layer 30 are annealed to produce a dielectric silicon oxide layer over the metal lines 50 and substrate 10. The dielectric layer formed by through the embodiment of the method of the invention has more uniform density than a dielectric layer formed by conventional technology.

Figure 8:
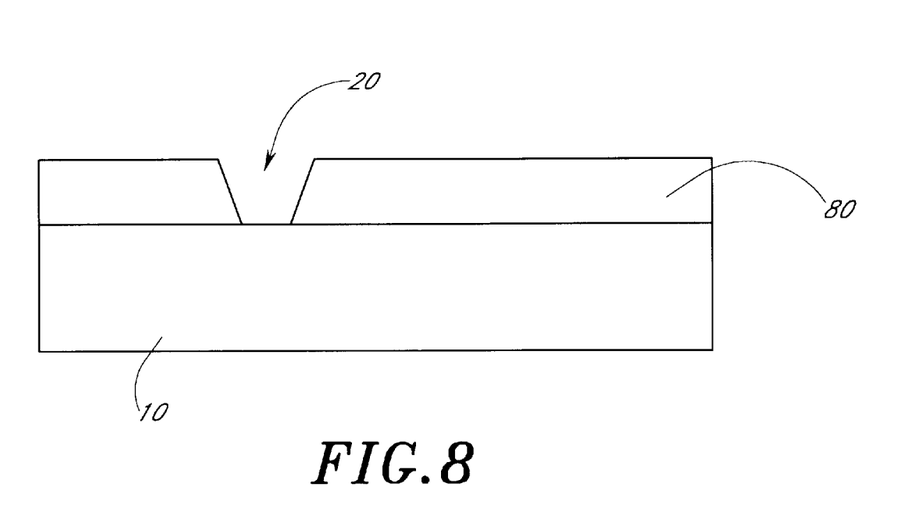
FIG. 8 is a partial cross-sectional view of a substrate covered with an interlayer dielectric layer with a trench.

Another embodiment of the method is illustrated in FIG. 8. An interlayer dielectric layer 80 of silica is formed on the substrate 10 by depositing a liquid-containing layer comprising silicon formed by the FLOWFILL™ process or the spin-on process, contacting the liquid-containing layer 30 with the liquid-attractive liquid, separating the liquid-attractive liquid 40 from the liquid-containing layer 30, and annealing the substrate 10 and liquid-containing layer 30 to form the silica interlayer dielectric layer 80. A trench 20 is formed in the interlayer dielectric layer 20 as shown in FIG. 8. The trench 20 is filled with metal by the damascene process. The interlayer dielectric layer 80 formed by the embodiment of the invention has more uniform density than a interlayer dielectric layer formed by conventional technology. A uniform interlayer dielectric layer 80 can: 1. insure a good etch profile of the trench; 2. remove all liquid to avoid outgassing which harms metal; and 3. provide better reliability.

In many applications, layers formed by contacting the liquid-containing layer 30 with the liquid-attractive liquid 40 to remove liquid from the liquid-containing layer 30 prior or during a phase transition are more homogeneous than the layers formed by conventional technology.

Various modifications and alterations of this invention will be apparent to those skilled in the art without departing from the scope and spirit of this invention. It should be understood that the invention is not limited to the embodiments disclosed herein, and that the claims should be interpreted as broadly as the prior art allows.

What is claimed is:

1. A method of treating a semiconductor substrate in a chamber, said method comprising:
    applying a first liquid comprising silicon and a dopant selected from the group consisting of arsenic, antimony, boron, phosphorus, and gallium onto said substrate;
    applying a second liquid onto said substrate;
    contacting said first liquid comprising silicon and said second liquid with a third liquid which attracts said second liquid, thereby removing at least a portion of said second liquid; and
    separating said third liquid from said first liquid comprising silicon on said substrate.

2. The method of claim 1, wherein said second liquid comprises water.

3. The method of claim 2, wherein said third liquid comprises a hygroscopic liquid.

4. The method of claim 3, wherein said hygroscopic liquid is selected from the group consisting of sulfuric acid, phosphoric acid, and a hygroscopic organic solvent.

5. The method of claim 3, wherein said hygroscopic liquid comprises sulfuric acid.

6. The method of claim 5, wherein said first liquid is contacted with said hygroscopic liquid comprising sulfuric acid at a temperature between 0 and 300° Centigrade.

7. The method of claim 5, wherein said first liquid is contacted with said hygroscopic liquid comprising sulfuric acid at a temperature between 100 and 200° Centigrade.

8. The method of claim 5, wherein said first liquid is contacted with said hygroscopic liquid comprising sulfuric acid at a temperature of approximately 150° Centigrade.

9. The method of claim 5, wherein said hygroscopic liquid comprising sulfuric acid is at a concentration between 50 and 98 weight percent sulfuric acid.

10. The method of claim 5, wherein said hygroscopic liquid comprising sulfuric acid is at a concentration of approximately 98 weight percent sulfuric acid.

11. The method of claim 1, wherein said first liquid comprising silicon comprises silicon dioxide.

12. The method of claim 1, wherein said applying comprises spin applying said first liquid comprising silicon and said second liquid onto said substrate.

13. The method of claim 1, wherein said applying comprises chemical vapor depositing said first liquid comprising silicon and said second liquid onto said substrate.

14. The method of claim 1, wherein said applying comprises:

introducing silicon-containing vapor and hydrogen peroxide vapor into said chamber; and reacting said silicon-containing vapor with said hydrogen peroxide vapor to form said first liquid comprising silicon and said second liquid, wherein said second liquid comprises water.

15. A method of treating a semiconductor substrate in a chamber, said method comprising:

applying a first liquid-containing layer onto said substrate;

heating said substrate and said first liquid-containing layer, thereby forming a second liquid-containing layer and a third liquid;

contacting said second liquid-containing layer and said third liquid with a fourth liquid which attracts said third liquid, thereby removing at least a portion of said third liquid; and separating said fourth liquid from said second liquid-containing layer on said substrate.

16. The method of claim 15, wherein said applying comprises spin applying said first liquid onto said substrate.

17. The method of claim 15, wherein said first liquid-containing layer comprises a siloxane or an organosiloxane.

18. The method of claim 17, wherein said third liquid comprises water and said second liquid-containing layer comprises higher oligomers of said siloxane or said organosiloxane.

19. The method of claim 18, further comprising annealing said substrate and said second liquid-containing layer, thereby forming a layer comprising silicon dioxide.

* * * * *

UNITED STATES PATENT AND TRADEMARK OFFICE
CERTIFICATE OF CORRECTION

PATENT NO.    : 6,395,647 B1
DATED         : May 28, 2002
INVENTOR(S)   : Li et al.

It is certified that error appears in the above-identified patent and that said Letters Patent is hereby corrected as shown below:

Column 3,
Line 3, please replace "then" with -- the --.

Signed and Sealed this

Eighth Day of April, 2003

JAMES E. ROGAN
*Director of the United States Patent and Trademark Office*